United States Patent
Harame et al.

(10) Patent No.: US 8,871,600 B2
(45) Date of Patent: Oct. 28, 2014

(54) SCHOTTKY BARRIER DIODES WITH A GUARD RING FORMED BY SELECTIVE EPITAXY

(75) Inventors: David L. Harame, Essex Junction, VT (US); Qizhi Liu, Lexington, MA (US); Robert M. Rassel, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 390 days.

(21) Appl. No.: 13/294,760

(22) Filed: Nov. 11, 2011

(65) Prior Publication Data

US 2013/0119505 A1    May 16, 2013

(51) Int. Cl.
| | | |
|---|---|---|
| H01L 21/8222 | (2006.01) | |
| H01L 29/47 | (2006.01) | |
| H01L 27/07 | (2006.01) | |
| H01L 29/66 | (2006.01) | |
| H01L 29/732 | (2006.01) | |
| H01L 29/872 | (2006.01) | |
| H01L 29/08 | (2006.01) | |
| H01L 29/161 | (2006.01) | |

(52) U.S. Cl.
CPC ............ *H01L 29/47* (2013.01); *H01L 27/0766* (2013.01); *H01L 29/66143* (2013.01); *H01L 29/66234* (2013.01); *H01L 29/7322* (2013.01); *H01L 29/872* (2013.01); *H01L 29/0821* (2013.01); *H01L 29/161* (2013.01)
USPC ..................................... 438/328; 257/E27.04

(58) Field of Classification Search
CPC ....................... H01L 27/0766; H01L 29/66143
USPC ..................... 257/E27.04; 438/328
See application file for complete search history.

(56) References Cited

U.S. PATENT DOCUMENTS

| | | | |
|---|---|---|---|
| 3,820,235 | A | 6/1974 | Goldman |
| 4,742,377 | A | 5/1988 | Einthoven |
| 5,225,359 | A | 7/1993 | DeLong |
| 5,917,228 | A | 6/1999 | Matsuda et al. |
| 6,207,511 | B1 | 3/2001 | Chapman et al. |
| 6,218,222 | B1 | 4/2001 | Brown et al. |
| 6,331,455 | B1 | 12/2001 | Rodov et al. |

(Continued)

FOREIGN PATENT DOCUMENTS

| | | |
|---|---|---|
| JP | 2000-012872 A | 1/2000 |
| JP | 2002-289881 A | 10/2002 |
| JP | 2009-259952 A | 11/2009 |
| JP | 2010-040698 A | 2/2010 |

OTHER PUBLICATIONS

Pfeiffer, et al., "Schottky Barrier Diode Circuits in Silicon for Future Millimeter-Wave and Terahertz Applications" IEEE Transactions on Microwave Theory and Techniques, vol. 56, issue 2, pp. 364-371.

(Continued)

*Primary Examiner* — Daniel Luke
(74) *Attorney, Agent, or Firm* — Wood, Herron & Evans LLP; Anthony J. Canale

(57) ABSTRACT

Schottky barrier diodes, methods for fabricating Schottky barrier diodes, and design structures for a Schottky barrier diode. A guard ring for a Schottky barrier diode is formed with a selective epitaxial growth process. The guard ring for the Schottky barrier diode and an extrinsic base of a vertical bipolar junction diode on a different device region than the Schottky barrier diode may be concurrently formed using the same selective epitaxial growth process.

11 Claims, 11 Drawing Sheets

(56) References Cited

U.S. PATENT DOCUMENTS

| | | |
|---|---|---|
| 6,514,779 B1 | 2/2003 | Ryu et al. |
| 6,693,308 B2 | 2/2004 | Sankin et al. |
| 6,734,461 B1 | 5/2004 | Shiomi et al. |
| 6,767,783 B2 | 7/2004 | Casady et al. |
| 6,891,207 B2 | 5/2005 | Pequignot et al. |
| 6,949,454 B2 | 9/2005 | Swanson et al. |
| 7,294,860 B2 | 11/2007 | Mazzola et al. |
| 7,307,329 B2 | 12/2007 | Ahrens et al. |
| 7,416,929 B2 | 8/2008 | Mazzola et al. |
| 7,728,350 B2 | 6/2010 | Bhattacharyya |
| 7,737,532 B2 | 6/2010 | Ke et al. |
| 2002/0019115 A1 | 2/2002 | Rodov et al. |
| 2009/0224355 A1* | 9/2009 | Irace et al. ............... 257/481 |
| 2010/0320476 A1 | 12/2010 | Cheng et al. |
| 2011/0001191 A1 | 1/2011 | Shima et al. |
| 2012/0007097 A1* | 1/2012 | Hebert ............... 257/76 |

OTHER PUBLICATIONS

"Schottky Barrier Diodes for Millimeter Wave SiGe BiCMOS Applications", by Rassel, Robert M.; et al; IEEE BCTM2006 Proceedings; Oct. 2006.

* cited by examiner

SCHOTTKY BARRIER DIODES WITH A GUARD RING FORMED BY SELECTIVE EPITAXY

BACKGROUND

The present invention relates to semiconductor device fabrication and, more specifically, to device structures for a Schottky barrier diode, fabrication methods for Schottky barrier diodes, and design structures for a Schottky barrier diode.

Schottky barrier diodes are semiconductor diodes characterized by low forward voltage drop and fast switching action. A typical Schottky barrier diode features a conductor-semiconductor junction that provides rectifying characteristics, such as junction between highly-doped silicon and metal silicide layers. A Schottky barrier diode may include a guard ring that prevents excessive leakage current.

To extend the capabilities of the technology, improved device structures, fabrication methods, and design structures are needed for Schottky barrier diodes.

SUMMARY

According to one embodiment of the present invention, a method is provided for fabricating a device structure. The method includes a Schottky barrier diode and forming a guard ring for a Schottky barrier diode with a selective epitaxial growth process.

According to another embodiment of the present invention, a device structure includes a device region, a Schottky barrier diode, and a guard ring for the Schottky barrier diode. The device region is comprised of a first semiconductor material. The Schottky barrier diode has an anode on a top surface of the device region, a cathode in the device region, and a Schottky junction defined between the anode and cathode. The guard ring is comprised of a second semiconductor material having an epitaxial relationship with the first semiconductor material.

According to another embodiment of the present invention, a design structure is provided that is readable by a machine used in design, manufacture, or simulation of an integrated circuit. The design structure includes a device region, a Schottky barrier diode, and a guard ring for the Schottky barrier diode. The device region is comprised of a first semiconductor material. The Schottky barrier diode has an anode on a top surface of the device region, a cathode in the device region, and a Schottky junction defined between the anode and cathode. The guard ring is comprised of a second semiconductor material having an epitaxial relationship with the first semiconductor material. The design structure may comprise a netlist. The design structure may also reside on storage medium as a data format used for the exchange of layout data of integrated circuits. The design structure may reside in a programmable gate array.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

FIGS. 2A-10A and 2B-10B are cross-sectional views of the respective substrate portions shown in FIGS. 1A, 1B at successive subsequent fabrication stages of the processing method.

DETAILED DESCRIPTION

Figure 1A:
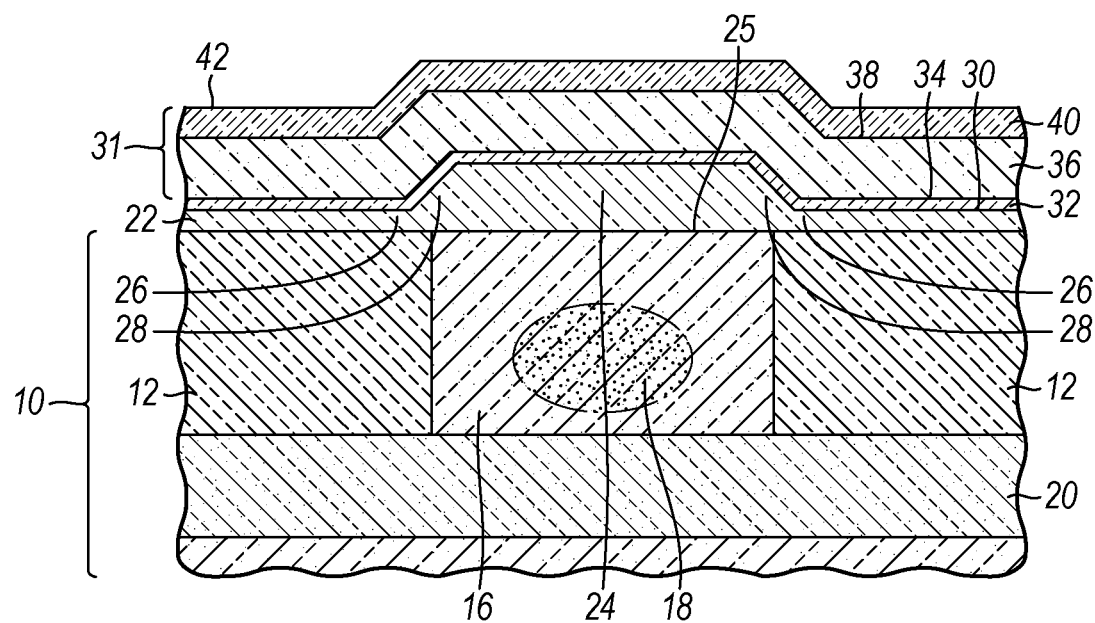
FIG. 1A is a cross-sectional view of a portion of a substrate at an initial stage of a processing method for fabricating a bipolar junction transistor in accordance with an embodiment of the invention.
Figure 1B:
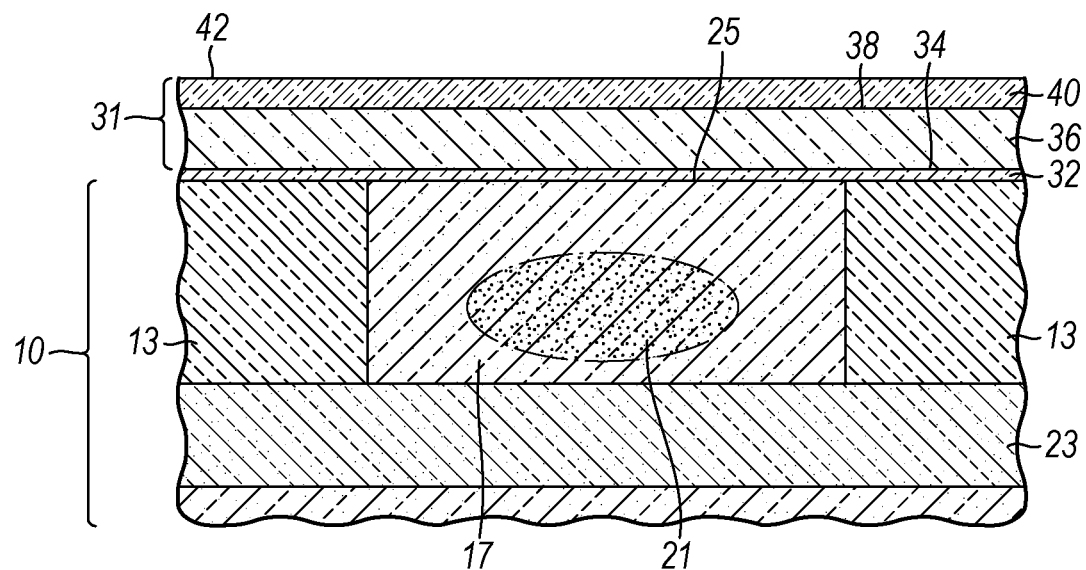
FIG. 1B is a cross-sectional view similar to FIG. 1A of a different portion of the substrate at an initial stage of a processing method for fabricating a Schottky barrier diode in accordance with an embodiment of the invention.
Figure 10A:
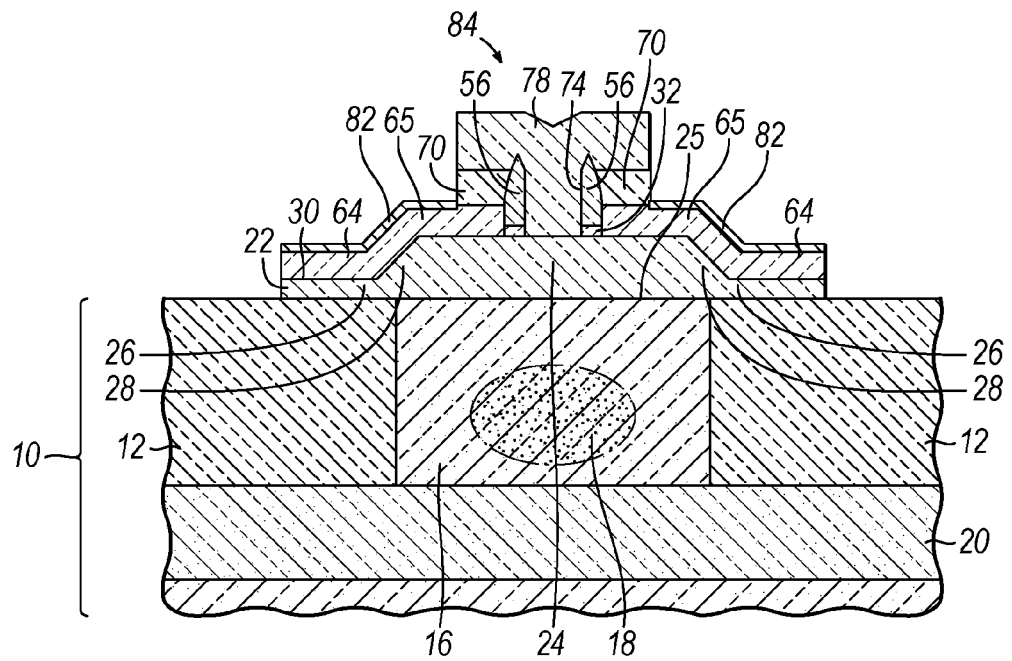
Figure 10B:
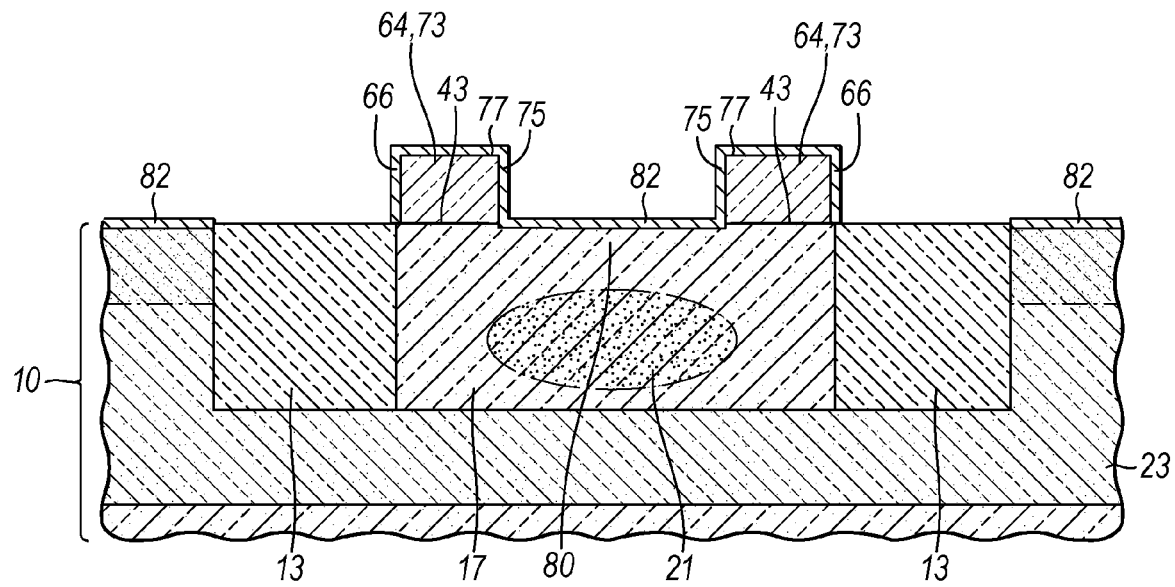

With reference to FIGS. 1A, 1B and in accordance with an embodiment of the invention, a substrate 10 includes trench isolation regions 12, 13 that circumscribe and electrically isolate device regions 16, 17. Device region 16 is used in the fabrication of a bipolar junction transistor 84 (FIG. 10A). Device region 17 is used in the fabrication of a Schottky barrier diode 86 (FIG. 10B).

The substrate 10 may be any type of suitable bulk substrate comprising a semiconductor material suitable for forming an integrated circuit. For example, the substrate 10 may be a wafer comprised of a monocrystalline silicon-containing material, such as single crystal silicon wafer with a (100) crystal lattice orientation. The monocrystalline semiconductor material of the substrate 10 may contain a definite defect concentration and still be considered single crystal. The semiconductor material comprising substrate 10 may include an optional epitaxial layer on a bulk substrate, such as an epitaxial layer comprised of lightly-doped n-type semiconductor material that defines a top surface 25 and that covers an oppositely-doped bulk substrate.

Trench isolation regions 12, 13 may be isolation structures formed by a shallow trench isolation (STI) technique that relies on a lithography and dry etching process to define closed-bottomed trenches in substrate 10, fill the trenches with dielectric, and planarize the layer relative to the top surface 25 of the substrate 10 using a chemical mechanical polishing (CMP) process. The dielectric may be comprised of an oxide of silicon, such as densified tetraethylorthosilicate (TEOS) deposited by chemical vapor deposition (CVD) or a high-density plasma (HDP) oxide deposited with plasma assistance.

A collector region 18 and a subcollector region 20 of the bipolar junction transistor 84 are present as impurity-doped regions in the device region 16. Similarly, impurity-doped regions 21, 23 are present in the device region 17. The collector region 18, subcollector region 20, and impurity-doped regions 21, 23 may be formed beneath the top surface 25 by introducing an electrically-active dopant, such as an impurity species from Group V of the Periodic Table (e.g., phosphorus (P), arsenic (As), or antimony (Sb)) effective to impart an n-type conductivity in which electrons are the majority carriers and dominate the electrical conductivity of the host semiconductor material. In one embodiment, collector region 18, subcollector region 20, and impurity-doped regions 21, 23 may be formed by ion implanting an n-type impurity species and thereafter annealing to activate the impurity species and lessen implantation damage using techniques and conditions familiar to one skilled in the art. In one specific embodiment, the collector region 18 and impurity-doped region 21 may each comprise a selectively implanted collector (SIC) formed by implanting an n-type dopant with selected dose and kinetic energy into the central part of the device regions 16, 17 and may be formed at any appropriate point in the process flow. In one specific embodiment, the subcollector region 20 and impurity doped region 23 may be formed by a high-current ion implantation followed by lengthy, high temperature thermal anneal process that dopes a thickness of the substrate 10 before the optional epitaxial layer is formed. During process steps subsequent to implantation, the dopant in the collector region 18 may diffuse laterally and vertically such that substantially the entire central portion of device region 16 becomes doped and continuous structurally is and electrically with the subcollector region 20. Similarly, the dopant in the impurity-doped region 21 may also exhibit transport from diffusion similar to the dopant diffusion experienced by the collector region 18 and become structurally and electrically continuous with the impurity doped region 23 as well as extend to the top surface 25.

An intrinsic base layer 22, which is comprised of a material suitable for forming an intrinsic base of the bipolar junction transistor 84, is deposited as a continuous additive layer on the top surface 25 of substrate 10 and, in particular on the top surface 25 of the device region 16. In the representative embodiment, the intrinsic base layer 22 directly contacts the top surface 25 of the device region 16 and a top surface of the trench isolation regions 12, 13. The intrinsic base layer 22 may be comprised of a semiconductor material, such as silicon-germanium (SiGe) including silicon (Si) and germanium (Ge) in an alloy with the silicon content ranging from 95 atomic percent to 50 atomic percent and the germanium content ranging from 5 atomic percent to 50 atomic percent. The germanium content of the intrinsic base layer 22 may be uniform or the germanium content of intrinsic base layer 22 may be graded or stepped across the thickness of intrinsic base layer 22. Alternatively, the intrinsic base layer 22 may be comprised of a different semiconductor material, such as silicon (Si). The intrinsic base layer 22 may be doped with one or more impurity species, such as boron and/or carbon.

Intrinsic base layer 22 may be formed using a low temperature epitaxial (LTE) growth process (typically at a growth temperature ranging from 400° C. to 850° C.). The epitaxial growth process is performed after the trench isolation regions 12, 13 are formed. The epitaxial growth process is non-selective as single crystal semiconductor material (e.g., single crystal silicon or SiGe) may be deposited epitaxially onto any exposed crystalline surface such as the exposed top surface 25 of device region 16, and non-monocrystalline semiconductor material (e.g., polysilicon or polycrystalline SiGe) is deposited non-epitaxially onto the non-crystalline material of the trench isolation regions 12 or regions (not shown) where polycrystalline semiconductor material already exists.

The non-selectivity of the growth process causes the intrinsic base layer 22 to incorporate topography. Specifically, the intrinsic base layer 22 includes a raised region 24 above the device region 16, a non-raised region 26 surrounding the raised region 24, and a facet region 28 between the raised region 24 and the non-raised region 26. The raised region 24 of the intrinsic base layer 22 is comprised of monocrystalline semiconductor material and is laterally positioned in vertical alignment with the collector region 18. A top surface of the raised region 24 is elevated relative to a plane containing the top surface 25 of the device region 16. The raised region 24 is circumscribed by the shallow trench isolation regions 12.

The non-raised region 26 of the intrinsic base layer 22 is comprised of polycrystalline semiconductor material and overlies the trench isolation regions 12 near the raised region 24. In the absence of epitaxial seeding over the trench isolation regions 12, the non-raised region 26 forms with a low growth rate outside of the device region 16. The facet region 28 of the intrinsic base layer 22 may be comprised of monocrystalline material transitioning to polycrystalline material.

The thickness of the intrinsic base layer 22 may range from about 10 nm to about 600 nm with the largest layer thickness in the raised region 24 and the layer thickness of the non-raised region 26 less than the layer thickness of the raised region 24. The layer thicknesses herein are evaluated in a direction normal to the top surface 25 of substrate 10.

The intrinsic base layer 22 also forms on device region 17 and may be separated from the top surface 25 by one or more intervening layers (not shown). For example, the top surface 25 of device region 17 may be optionally covered by a thin layer of silicon dioxide ($SiO_2$) and an overlying polysilicon layer. The intrinsic base layer 22 and any other layers are removed from the top surface 25 of the device region 17 so that device region 17 is free of a layer of the semiconductor material constituting the intrinsic base layer 22. In particular, the intrinsic base layer 22 on device region 16 is masked and the semiconductor material of the intrinsic base layer 22 is removed from device region 17 using photolithography and an etching process. To that end, a patterned mask layer (not shown) is applied with an opening that exposes the semiconductor material of the intrinsic base layer 22 located on the device region 17. In one embodiment, the mask layer may be a photoresist layer comprised of a sacrificial organic material applied by spin coating and pre-baked. The photolithography process entails exposing the photoresist layer to radiation imaged through a photomask, baking, and developing the resultant latent feature pattern in the exposed resist to define the opening exposing the semiconductor material of the intrinsic base layer 22 located on the device region 17. An etching process, such as a reactive-ion etching (RIE) process is used to remove the semiconductor material of the intrinsic base layer 22 from the device region 17. This exposes the top surface 25 of the device region 17.

A base dielectric layer 32 is formed on a top surface 30 of intrinsic base layer 22 and, in the representative embodiment, directly contacts the top surface 30. In device region 16 (FIG. 1A), the base dielectric layer 32 reproduces the topography of the underlying intrinsic base layer 22. The base dielectric layer 32 is also formed on the top surface 25 of the device region 17 and may merge with any preexisting dielectric layer (e.g., $SiO_2$). The base dielectric layer 32 may be an insulating material with a dielectric constant (e.g., a permittivity) characteristic of a dielectric. In one embodiment, the base dielectric layer 32 may be a high temperature oxide (HTO) deposited using rapid thermal process (RTP) at temperatures of 500° C. or higher, and may be comprised of an oxide of silicon, such as $SiO_2$ having a nominal dielectric constant of 3.9. Alternatively, if the base dielectric layer 32 is comprised of oxide, the material of base dielectric layer 32 may be deposited by a different deposition process, by thermal oxidation of silicon (e.g., oxidation at high pressure with steam (HIPOX)), or by a combination of oxide formation techniques known to those of ordinary skill in the art.

A sacrificial layer stack 31 including sacrificial layers 36, 40 is then formed. Sacrificial layer 36 is deposited on a top surface 34 of base dielectric layer 32 and directly contacts the top surface 34. Sacrificial layer 40, which is optional, is deposited on a top surface 38 of sacrificial layer 36. The sacrificial layers 36, 40 reproduce the topography of the underlying intrinsic base layer 22 in device region 16. The sacrificial layer stack 31 is also formed on the top surface 25 of the device region 17 and is separated from the top surface 25 by the base dielectric layer 32.

Sacrificial layer 36 may be comprised of a material with a different etching selectivity than the material of the underlying base dielectric layer 32. In one embodiment, sacrificial layer 36 may be comprised of polycrystalline silicon (e.g., polysilicon) deposited by a conventional deposition process such as low pressure chemical vapor phase deposition (LPCVD) using either silane or disilane as a silicon source or physical vapor deposition (PVD). Sacrificial layer 40 may be comprised of a dielectric material with a different etching selectivity than the material of the underlying sacrificial layer 36. In one embodiment, sacrificial layer 40 may be comprised of $SiO_2$ deposited by CVD or another suitable deposition process.

Figure 2A:
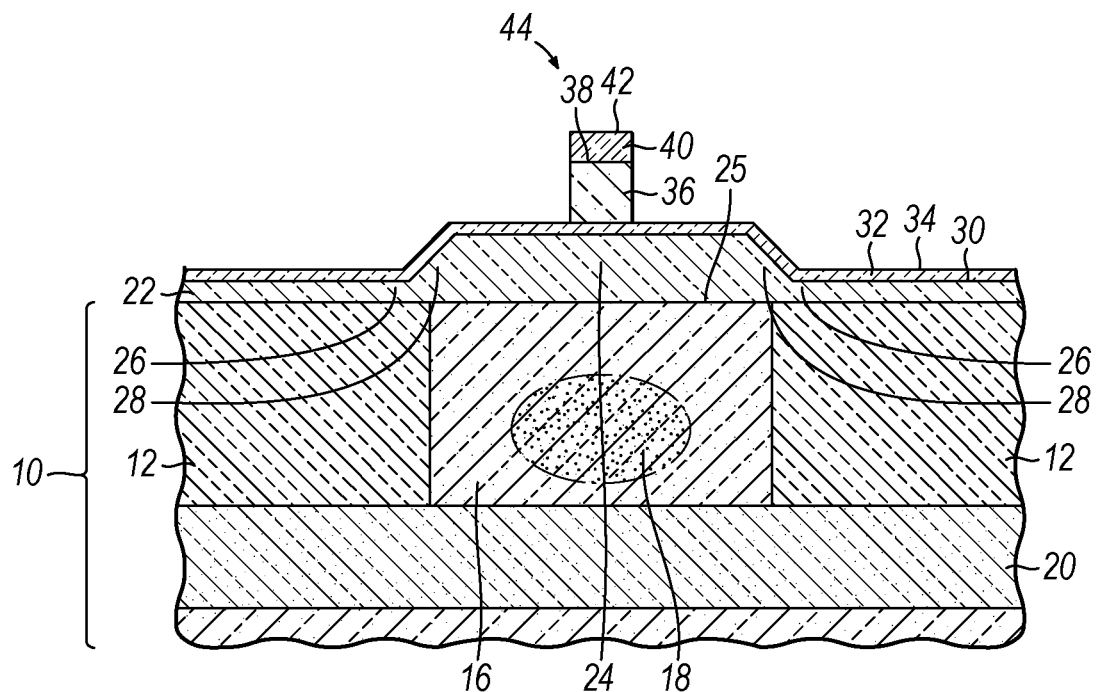
Figure 2B:
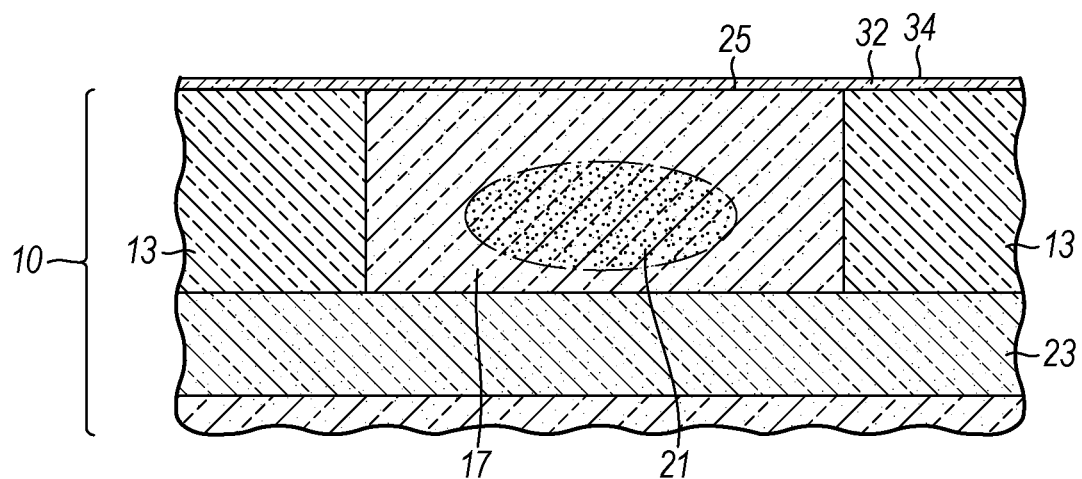

With reference to FIGS. 2A, 2B in which like reference numerals refer to like features in FIGS. 1A, 1B and at a subsequent fabrication stage, the sacrificial layers 36, 40 of the sacrificial layer stack 31 are patterned using photolithography and etching processes to define sacrificial mandrels in the form of a sacrificial emitter pedestal 44. To that end, the sacrificial layer stack 31 is masked with a patterned mask layer (not shown). In one embodiment, the mask layer may be a photoresist layer comprised of a sacrificial organic material applied to the top surface 42 of sacrificial layer 40 by spin coating and pre-baked. The photolithography process entails exposing the photoresist layer to radiation imaged through a photomask, baking, and developing the resultant latent feature pattern in the exposed resist to define residual areas of photoresist that mask portions of sacrificial layer stack 31. In particular, the mask includes a resist strip covering a surface area on a top surface 42 of sacrificial layer 40 at the intended location of the sacrificial emitter pedestal 44.

An etching process, such as a reactive-ion etching (RIE) process, is used to remove regions of sacrificial layers 36, 40 not protected by the mask layer. For example, an initial segment of the etching process may remove unprotected regions of sacrificial layer 40 and stop on the material of sacrificial layer 36. The etch chemistry may be changed to remove unprotected regions of the underlying sacrificial layer 36 and stop on the material of base dielectric layer 32. Alternatively, a simpler etch chemistry might be used that includes fewer etch steps and removes both sacrificial layers 36, 40. At the conclusion of the etching process, the top surface 34 of base dielectric layer 32 is exposed in device region 17 aside from the portion of the top surface 34 covered by the sacrificial emitter pedestal 44.

Figure 3A:
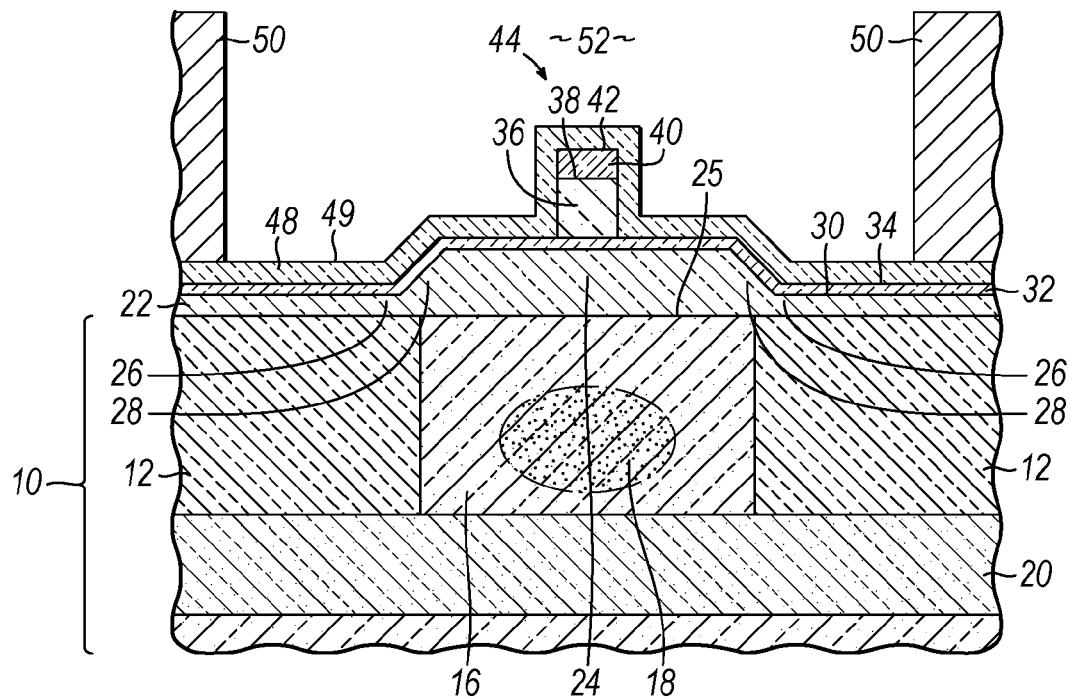
Figure 3B:
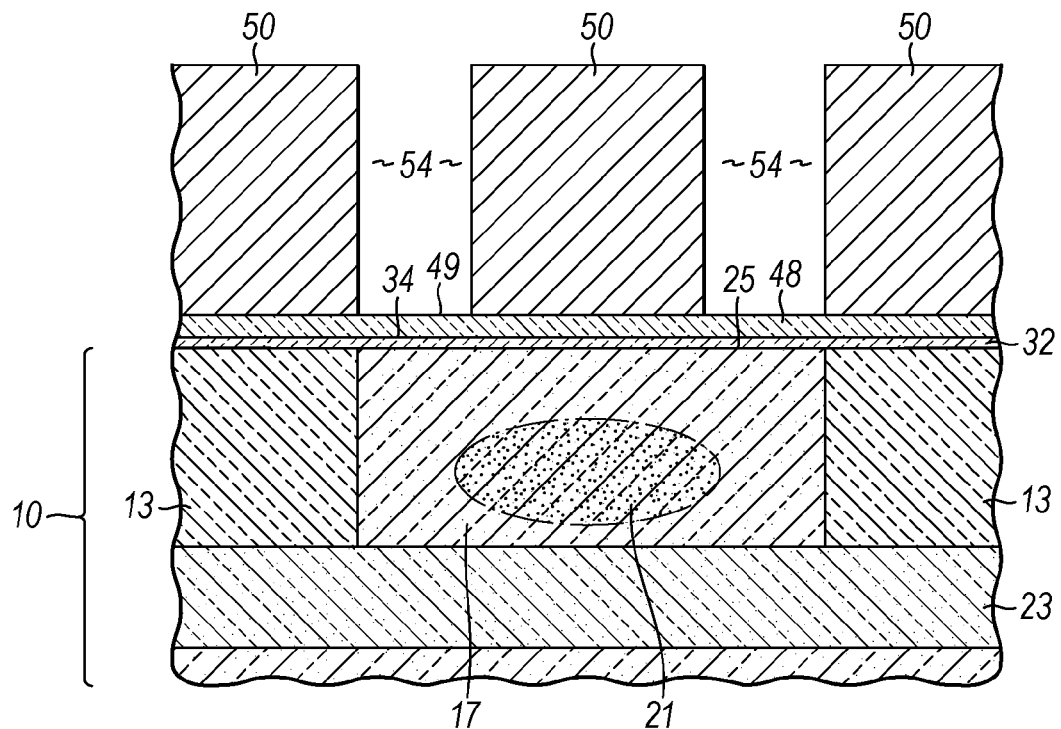

With reference to FIGS. 3A, 3B in which like reference numerals refer to like features in FIGS. 2A, 2B and at a subsequent fabrication stage, a hardmask layer 48 is formed on device regions 16, 17. The hardmask layer 48 may be a conformal blanket layer with a thickness that is independent of the topography of underlying features, such as the sacrificial emitter pedestal 44. Hardmask layer 48 may be comprised of a dielectric material with a different etching selectivity than the underlying base dielectric layer 32. In one embodiment, hardmask layer 48 may be comprised of silicon nitride ($Si_3N_4$) deposited using CVD. Alternatively, the material of hardmask layer 48 may be deposited by another suitable deposition process.

After hardmask layer 48 is deposited, a resist layer 50 comprised of a radiation-sensitive organic material is applied to a top surface 49 of hardmask layer 48 by spin coating, pre-baked, exposed to radiation to impart a latent image of a pattern including windows 52, 54, baked, and then developed with a chemical developer. Windows 52, 54 are defined as respective openings in the resist layer 50.

Figure 4A:
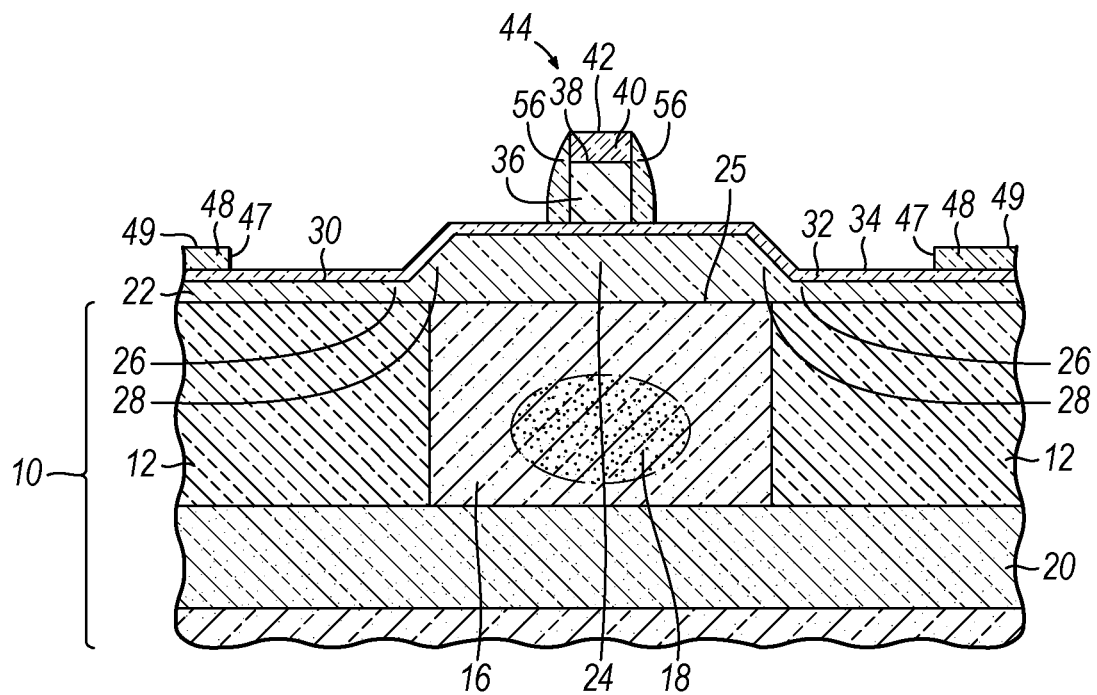
Figure 4B:
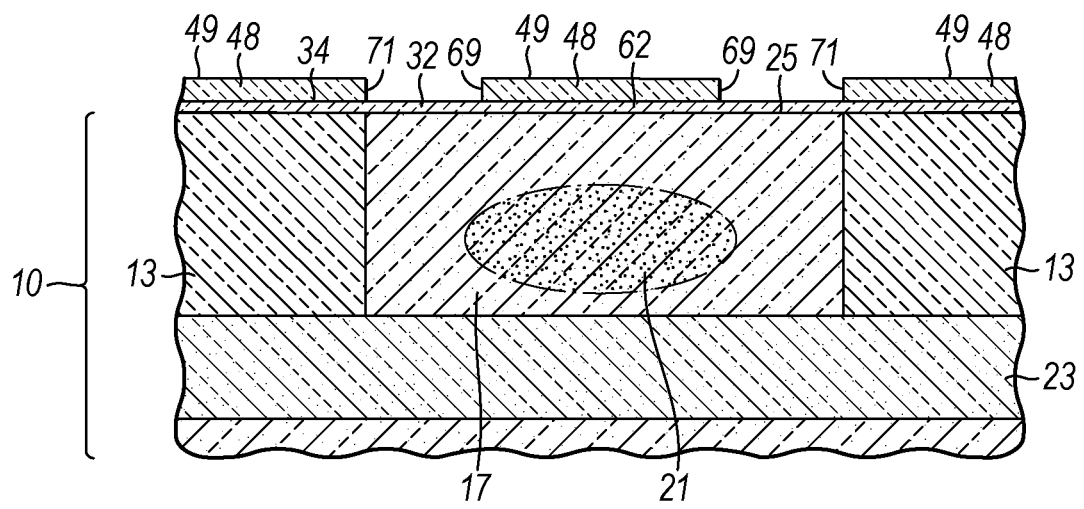

With reference to FIGS. 4A, 4B in which like reference numerals refer to like features in FIGS. 3A, 3B and at a subsequent fabrication stage, an etching process, such as a directional anisotropic etching process like RIE that preferentially removes dielectric material from horizontal surfaces, may be used to remove portions of the hardmask layer 48 in regions unmasked by the resist layer 50 (FIGS. 3A, 3B). The etching process also etches the hardmask layer 48 to form non-conductive spacers 56 on the sidewalls of the sacrificial emitter pedestal 44. The non-conductive spacers 56 surround the sidewalls of the sacrificial emitter pedestal 44. In one embodiment, the etching process is selected with an etch chemistry that selectively removes $Si_3N_4$ in hardmask layer 48 relative to $SiO_2$ in the base dielectric layer 32. Following the etching process, the resist layer 50 is removed by oxygen plasma ashing and/or wet chemical stripping.

An opening surrounded by an interior edge 47 is defined by the etching process in the hardmask layer 48 at the location of window 52 (FIG. 3A) and extends through the hardmask layer 48 to the top surface 34 of base dielectric layer 32. Another opening with an interior edge 71 is defined in the hardmask layer 48 at the location of window 54 (FIG. 3B) and extends to top surface 34 of base dielectric layer 32. A strip 62 of the base dielectric layer 32 is peripherally inside the interior edge 71 and is covered by a region of the hardmask layer 48 having an exterior edge 69.

Figure 5A:
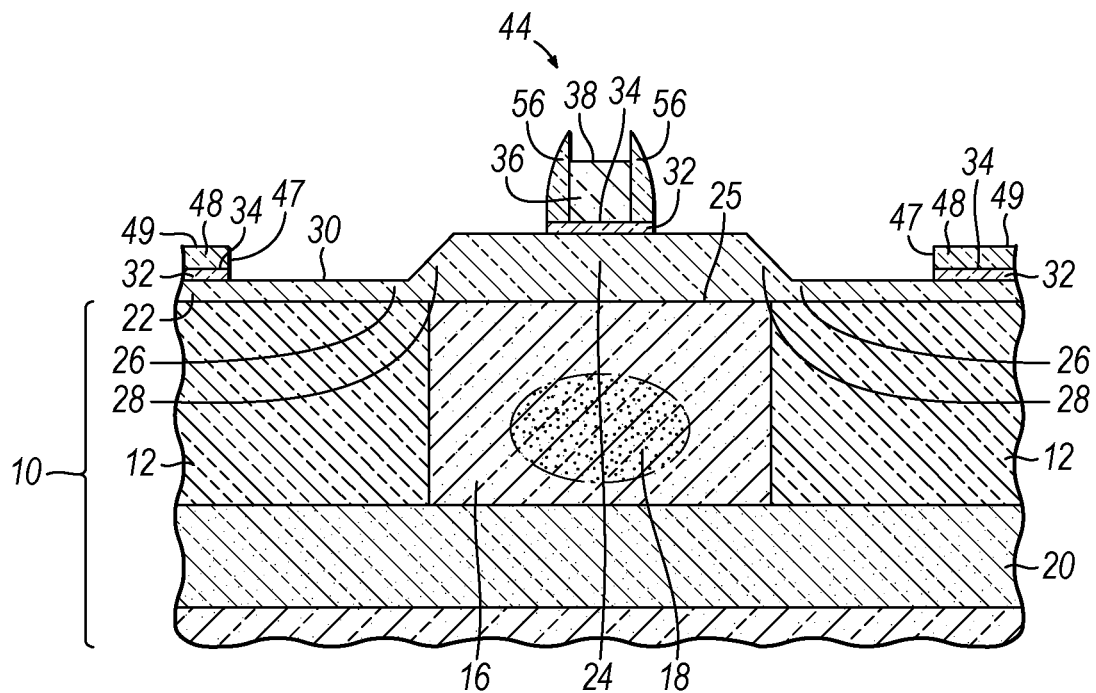
Figure 5B:
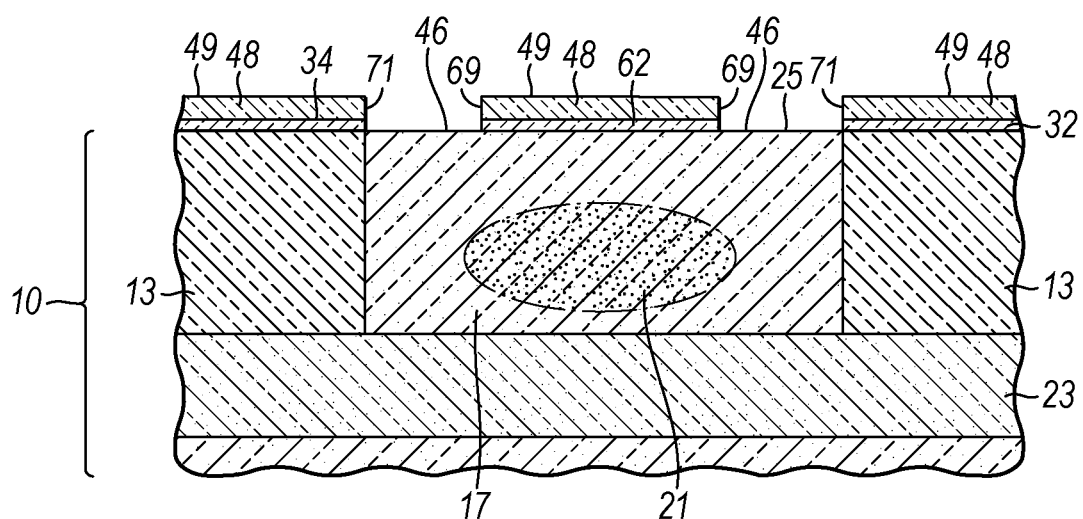

With reference to FIGS. 5A, 5B in which like reference numerals refer to like features in FIGS. 4A, 4B and at a subsequent fabrication stage, regions of the base dielectric layer 32 that are not masked by the patterned hardmask layer 48 are selectively removed by an etching process that stops on the material constituting intrinsic base layer 22. The sacrificial emitter pedestal 44 and non-conductive spacers 56 also mask a surface area of the base dielectric layer 32 in device region 16.

The etching process exposed a portion of the top surface 30 of intrinsic base layer 22 in device region 16 between the interior edge 47 of the opening in the hardmask layer 48 and the non-conductive spacers 56 on the sacrificial emitter pedestal 44. This portion of the top surface 30 is an intended location for the extrinsic base layer 64 of the bipolar junction transistor 84. The etching process exposes a portion 46 of the top surface 25 of device region 17 between the exterior and interior edges 69, 71 of patterned hardmask layer 48. This portion of the top surface 25 is positioned at an intended location for the guard ring 73. The portion 46 of the top surface 25 is a closed geometrical shape, such as a ring shape or a rectangular shape, that surrounds the surface area of the top surface 25 of the device region 17 masked by the overlying region of the patterned hardmask layer 48.

In one embodiment, the etching process may be chemical oxide removal (COR) that removes the material of base dielectric layer 32, if comprised of $SiO_2$, with minimal undercut beneath the non-conductive spacers 56. A COR process utilizes a vapor or, more preferably, a mixture flow of hydrogen fluoride (HF) and ammonia ($NH_3$) in a ratio of 1:10 to 10:1 and may be performed at low pressures (e.g., of about 1 mTorr to about 100 mTorr) and room temperature. The COR process may be performed in situ in the deposition chamber or may be performed in an independent chamber. Sacrificial layer 40 is also removed, or optionally only partially removed, from the sacrificial layer stack 31 by the etching process. An optional hydrofluoric acid chemical cleaning procedure may follow the COR process.

Figure 6A:
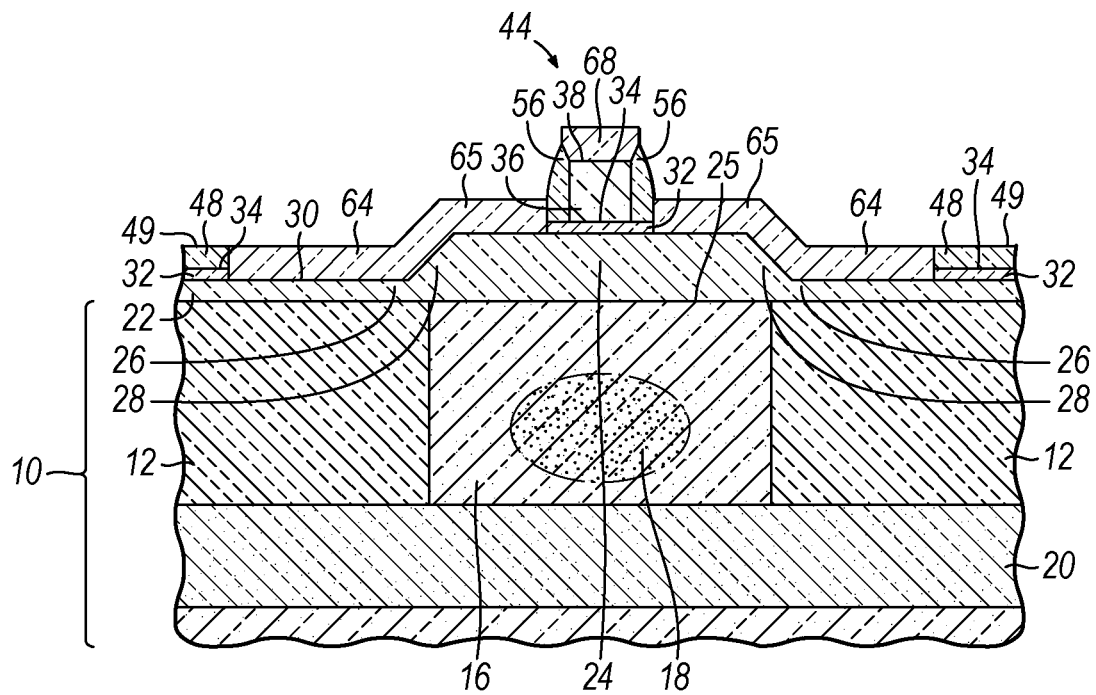
Figure 6B:
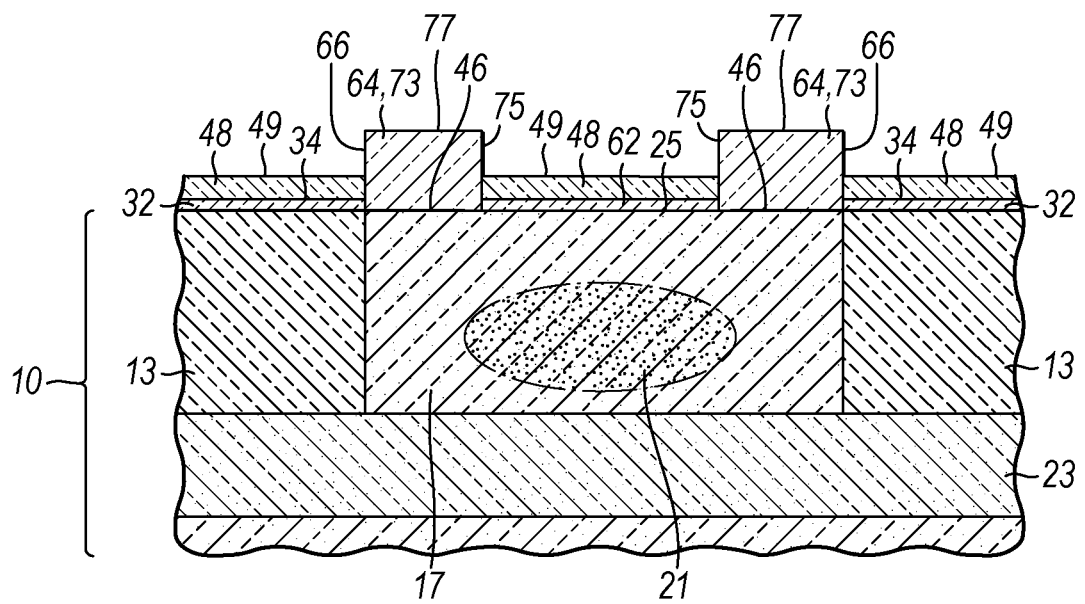

With reference to FIGS. 6A, 6B in which like reference numerals refer to like features in FIGS. 5A, 5B and at a subsequent fabrication stage, an extrinsic base layer 64 is formed on the portions of the top surface 30 of intrinsic base layer 22 in device region 16 and the portion 46 of the top surface 25 of the device region 17 that are not covered by the patterned hardmask layer 48. In the representative embodiment, the extrinsic base layer 64 directly contacts the respective top surfaces 25, 30. A cap 68 comprised of the material of the extrinsic base layer 64 are formed on top of the sacrificial layer 36 between non-conductive spacers 56. The material of the extrinsic base layer 64 does not form on hardmask layer 48 or on the non-conductive spacers 56.

In one embodiment, the extrinsic base layer 64 may be comprised of a semiconductor material (e.g., silicon or SiGe) formed by a selective epitaxial growth (SEG) deposition process. If comprised of SiGe, the concentration of Ge may have a graded or an abrupt profile if the extrinsic base layer 64 is comprised of SiGe, and may include additional layers, such as a Si cap. Epitaxial growth is a process by which a layer of single-crystal material, i.e., the extrinsic base layer 64, is deposited on a single-crystal substrate (i.e., the intrinsic base layer 22 and the device region 17) and in which the crystallographic structure of the single-crystal substrate is reproduced in the layer 64. If the chemical composition of the extrinsic base layer 64 differs from the chemical composition of the intrinsic base layer 22 and/or the device region 17, then a lattice constant mismatch may be present between the epitaxial material of the extrinsic base layer 64 and the intrinsic base layer 22 and/or the device region 17.

In an SEG deposition process, nucleation of the constituent semiconductor material is suppressed on insulators, such as on the top surface 49 of the hardmask layer 48 and on the non-conductive spacers 56. The selectivity of the SEG deposition process forming the extrinsic base layer 64 may be provided by an etchant, such as hydrogen chloride (HCl), in the reactant stream supplied to the SEG reaction chamber or by the germanium source, such as germane ($GeH_4$) or digermane ($Ge_2H_6$), supplied to the SEG reaction chamber. If the extrinsic base layer 64 does not contain germanium, then a separate etchant may be supplied to the SEG reaction chamber to provide the requisite selectivity. If the extrinsic base layer 64 contains germanium formed using a germanium source gas, the provision of an additional etchant to the SEG reaction chamber is optional.

The extrinsic base layer 64 may be in situ doped during deposition with a concentration of a dopant, such as an impurity species from Group III of the Periodic Table (e.g., boron or indium) effective to impart a p-type conductivity in which holes are the majority carriers and dominate the electrical conductivity of the host semiconductor material. The extrinsic base layer 64 may comprise heavily-doped p-type semiconductor material.

In device region 16, the material in the extrinsic base layer 64 is ultimately used to form an extrinsic base of the bipolar junction transistor 84. The uneven topography of the underlying intrinsic base layer 22 is at least partially reproduced in the extrinsic base layer 64 on device region 16 so that the extrinsic base layer 64 has a raised region 65 that overlies the raised region 24 of the intrinsic base layer 22.

In device region 17, a guard ring 73 for the Schottky barrier diode 86 (FIG. 10B) is formed from the material of the extrinsic base layer 64. The guard ring 73 is comprised of the semiconductor material of the extrinsic base layer 64 that forms on the portion 46 of the top surface 25 the device region 17 and directly contacts the top surface 25. An inner sidewall 75 of the guard ring 73 surrounds the strip 62 of the base dielectric layer 32 and the overlying region of the hardmask layer 48. The inner sidewall 75 constitutes a portion of an external surface 66 of the guard ring 73. The guard ring 73 has a geometrical shape that reproduces the geometrical shape of the portion 46 of the top surface 25 in device region 17. Similar to the portion 46 of the top surface 25 in device region 17, the guard ring 73 may be substantially circular or may have a polygonal (e.g., rectangular) shape, although other closed geometrical shapes may be permitted. A top surface 77 of the guard ring 73 is elevated or raised above the top surface 25 of the device region 17 so that the surfaces 25, 77 are in different planes separated by the height of the guard ring 73.

Figure 7A:
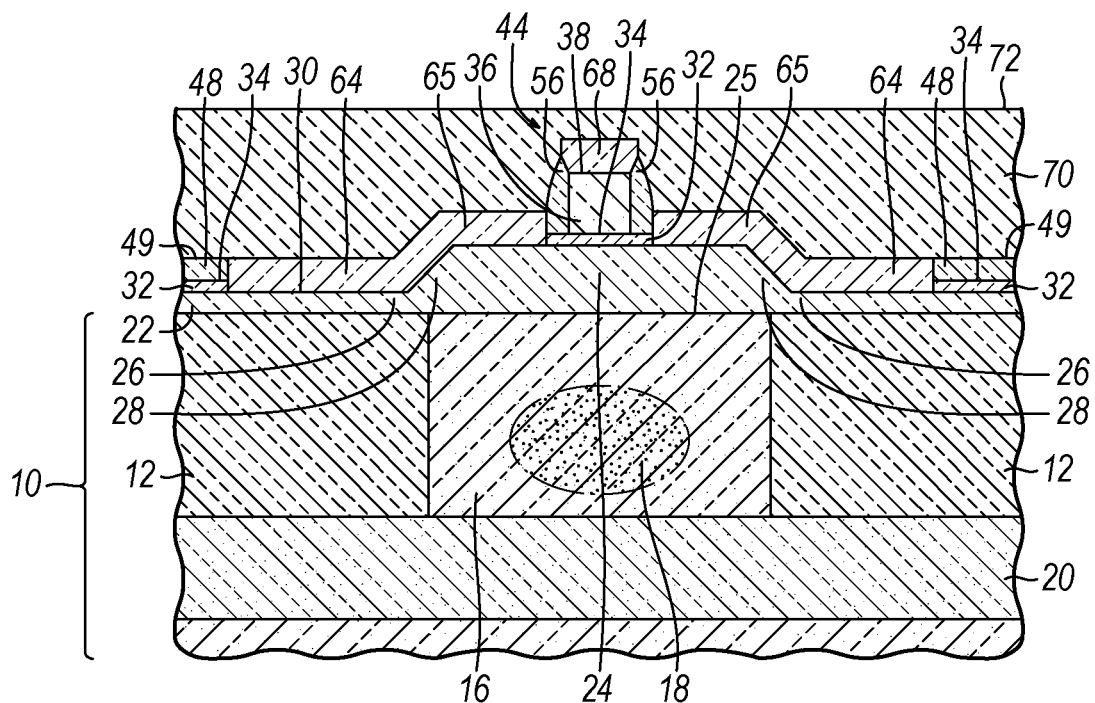
Figure 7B:
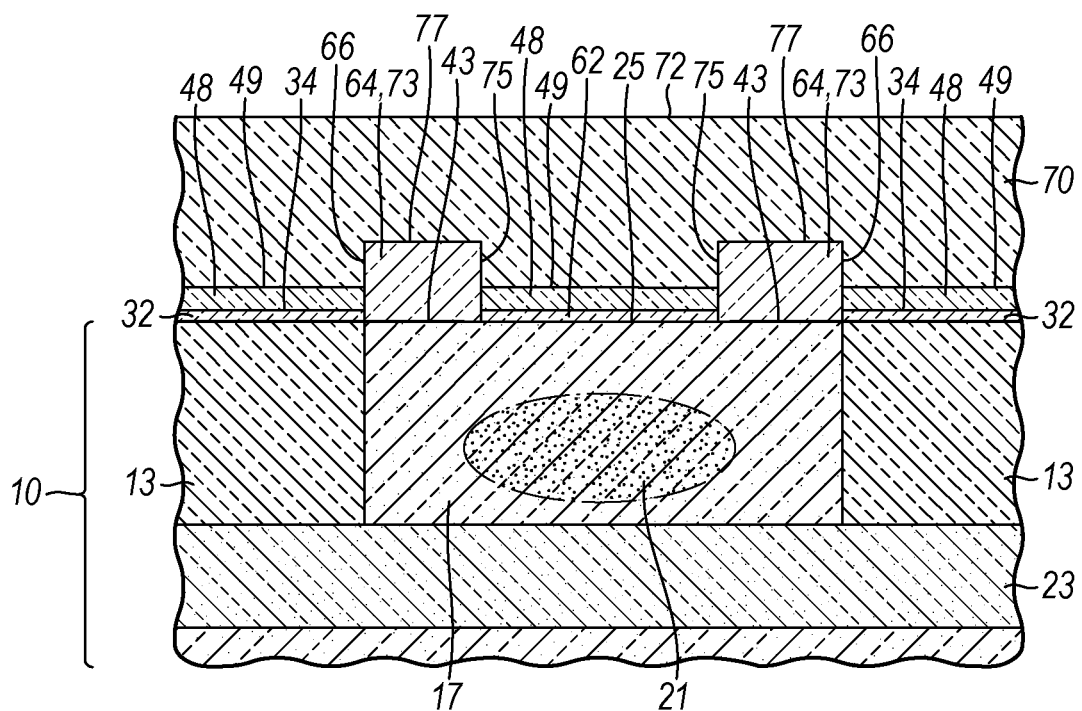

With reference to FIGS. 7A, 7B in which like reference numerals refer to like features in FIGS. 6A, 6B and at a subsequent fabrication stage, an insulating layer 70 is deposited that buries the sacrificial emitter pedestal 44 and the guard ring 73. The insulating layer 70 may be comprised of a dielectric, which is an insulating material having a dielectric constant (e.g., permittivity) characteristic of a dielectric material. In one embodiment, insulating layer 70 may be comprised of $SiO_2$ formed by plasma-enhanced CVD (PECVD) or another suitable deposition process. A top surface 72 of the insulating layer 70 is planarized using a chemical-mechanical polishing (CMP) process so that the top surface 72 is flat. The CMP process combines abrasion and dissolution to remove a thickness of the insulating layer 70 so that the non-planar topography of the top surface 72 from the presence of the sacrificial emitter pedestal 44 is reduced or eliminated, and the top surface 72 is flattened over device region 16. The CMP process is controlled such that the sacrificial emitter pedestal 44 and guard ring 73 remain buried beneath the top surface 72 of the insulator layer 70.

Figure 8A:
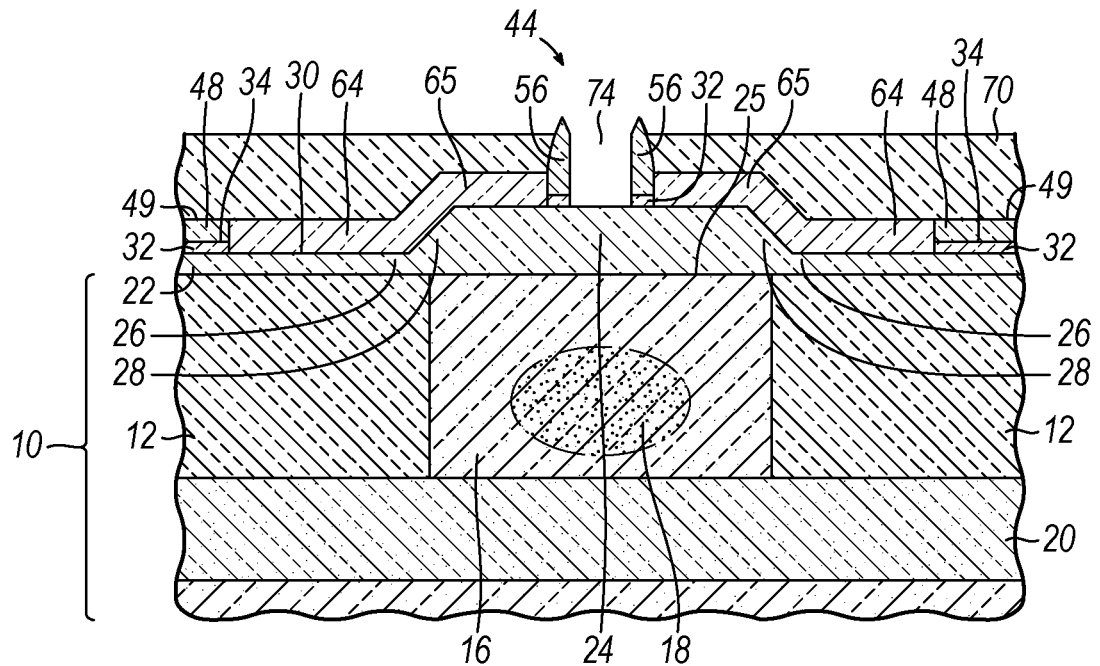
Figure 8B:
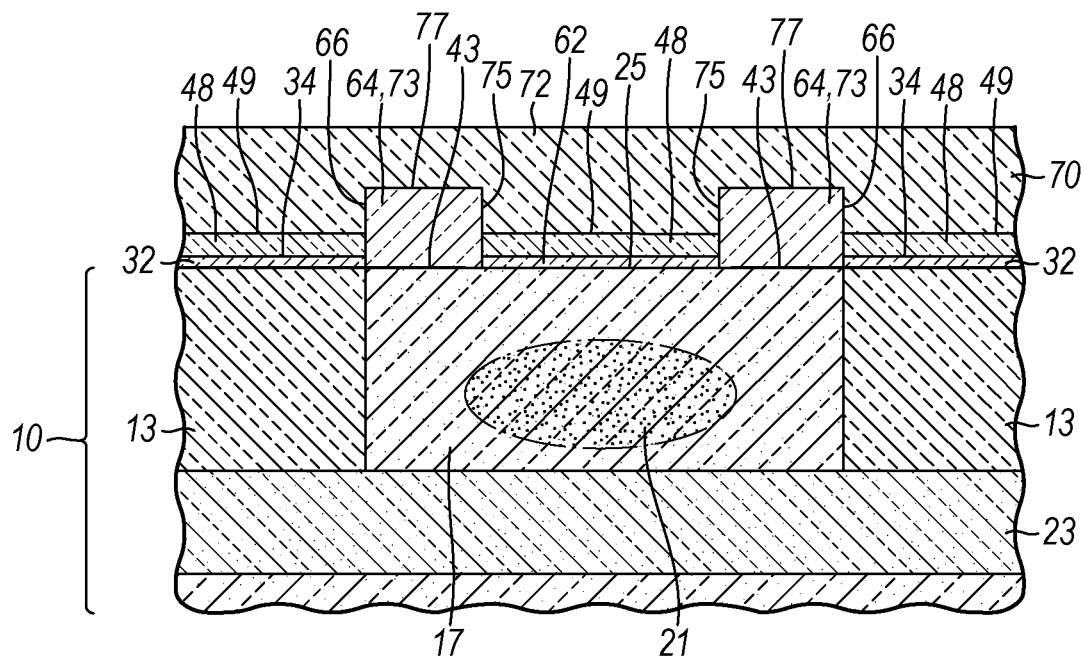

With reference to FIGS. 8A, 8B in which like reference numerals refer to like features in FIGS. 7A, 7B and at a subsequent fabrication stage, an emitter window 74 is formed between the non-conductive spacers 56. The emitter window 74 extends to the depth of the top surface 30 of intrinsic base layer 22. During the formation of the emitter window 74, the guard ring remains buried beneath the top surface 72 of the insulator layer 70.

To form the emitter window 74, the top surface 72 of insulating layer 70 is recessed relative to the sacrificial emitter pedestal 44 with an etching process, such as RIE. The recession of the insulating layer 70 exposes the cap 68 residing on the sacrificial layer 36. The sacrificial layer 36 and the cap 68 are then removed from its position between the non-conductive spacers 56 on the sacrificial emitter pedestal 44 after the recess of the top surface 72 of the insulating layer 70. Sacrificial layer 36 and cap 68 may be removed using dry etching process that is selective to the materials of base dielectric layer 32, hardmask layer 48, and non-conductive spacers 56. The etching process stops upon reaching the top surface 34 of the base dielectric layer 32. An etching process such as a hydrofluoric acid type procedure like a dilute hydrofluoric (DHF) or a buffered hydrofluoric (BHF) wet procedure, or a COR process is then applied to remove portions of the base dielectric layer 32 over the surface area between the non-conductive spacers 56. The thickness of the insulating layer 70 is selected such that the guard ring 73 is not modified by the etching processes forming the emitter window 74.

Figure 9A:
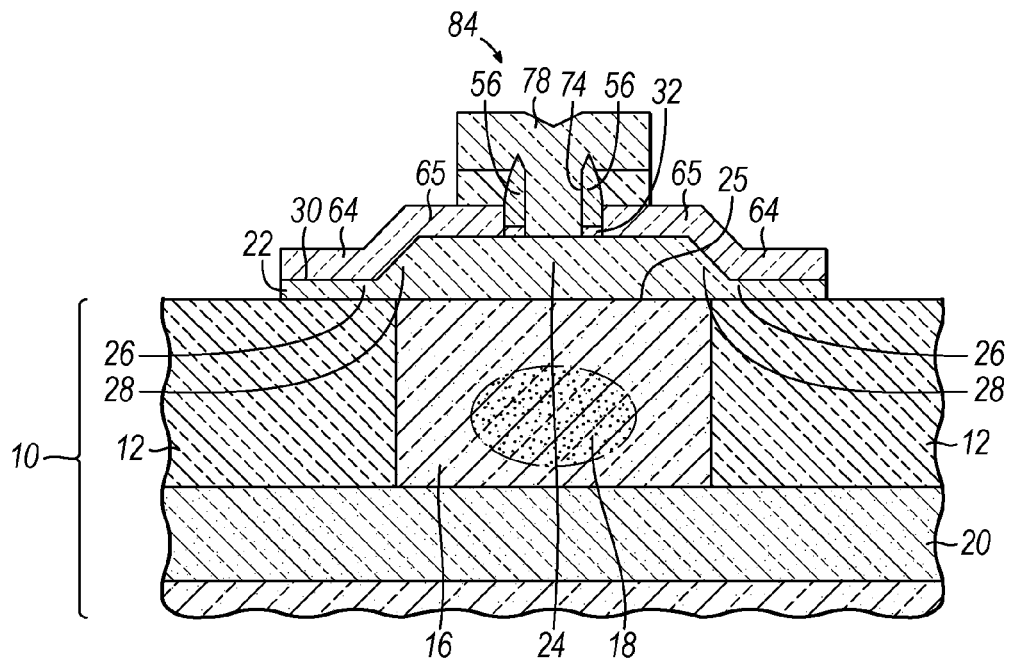
Figure 9B:
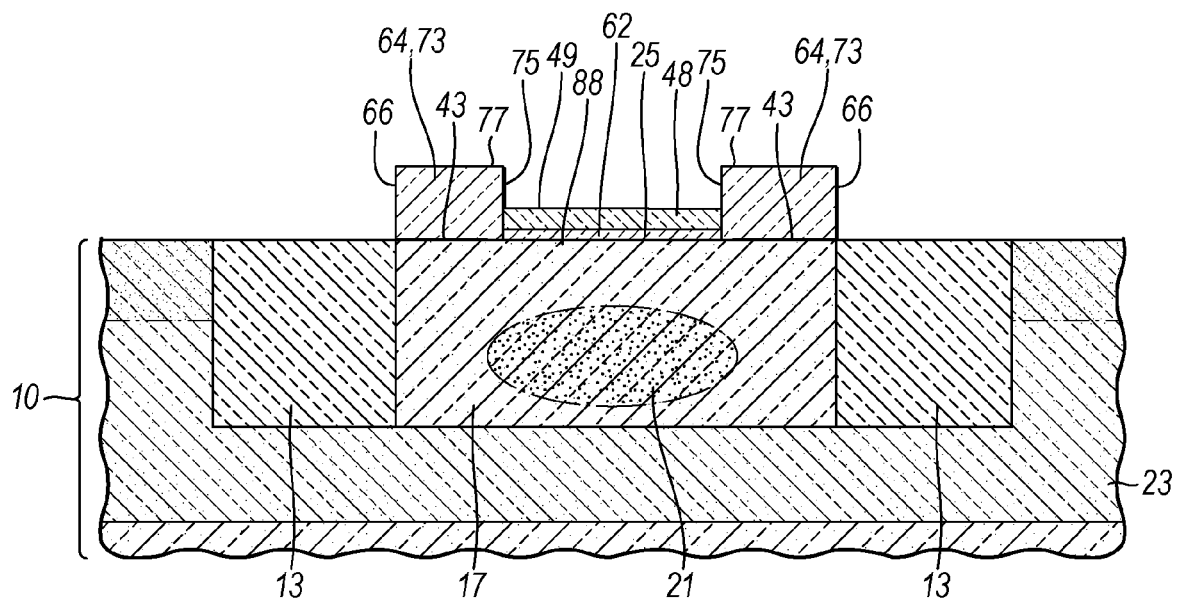

With reference to FIGS. 9A, 9B in which like reference numerals refer to like features in FIGS. 8A, 8B and at a subsequent fabrication stage, an emitter 78 of the bipolar junction transistor 84 is formed in the emitter window 74. The emitter 78 has a bottom surface that directly contacts the top surface 30 of the raised region 24 of intrinsic base layer 22. The emitter 78, which is T-shaped, includes a head that protrudes out of the emitter window 74 and above the top surface 72 of insulating layer 70. The non-conductive spacers 56 encircle or surround the emitter 78 for electrically isolating the emitter 78 from the extrinsic base layer 64.

The emitter 78 of the bipolar junction transistor 84 may be formed by depositing a layer comprised of a heavily-doped semiconductor material and then patterning the deposited layer using lithography and etching processes. For example, the emitter 78 may be formed from polysilicon deposited by CVD or rapid thermal CVD (RTCVD) and in situ doped with a heavy concentration of a dopant, such as an impurities species from Group V of the Periodic Table (e.g., arsenic) to impart n-type conductivity. The heavy-doping level modifies the resistivity of the polysilicon and may be implemented by in situ doping that adds a dopant gas to the CVD reactant gases during the deposition process.

The lithography process forming the emitter 78 from the layer of heavily-doped semiconductor material may utilize photoresist and photolithography to form an etch mask that protects only a strip of the heavily-doped semiconductor material spatially coincident with the emitter window 74. An etching process that stops on the material of insulating layer 70 is selected to shape the emitter 78 from the protected strip of heavily-doped semiconductor material. The mask is subsequently stripped, which exposes the top surface 72 of insulating layer 70 surrounding the emitter 78 and over the device region 17.

The insulating layer 70, the extrinsic base layer 64, and the intrinsic base layer 22 may be patterned using conventional photolithography and etching processes to define an extrinsic base and an intrinsic base of the bipolar junction transistor 84. The extrinsic base layer 64 is separated from the emitter 78 by the non-conductive spacers 56. Sections of insulating layer 70 may be retained between the extrinsic base layer 64 and the emitter 78. The insulating layer 70, hardmask layer 48, and base dielectric layer 32 are also removed from device region 17.

The insulating layer 70, the extrinsic base layer 64, and the intrinsic base layer 22 may be patterned using conventional photolithography and etching processes to define an extrinsic base and an intrinsic base of the bipolar junction transistor 84. The extrinsic base layer 64 is separated from the emitter 78 by the non-conductive spacers 56. Sections of insulating layer 70 may be retained between the extrinsic base and the emitter 78. The insulating layer 70, hardmask layer 48, and base dielectric layer 32 are also trimmed by similar patterning. A surface area of the top surface 25 of the device region 17 is exposed that is peripherally inside the inner sidewall 75 of the guard ring 73

With reference to FIGS. 10A, 10B in which like reference numerals refer to like features in FIGS. 9A, 9B and at a subsequent fabrication stage, a silicide layer 82 is formed on the top surface 25 of the device region 17 peripherally inside the inner sidewall 75 of the guard ring 73, on the guard ring 73, and on the extrinsic base layer 64 of the bipolar junction transistor 84. The silicide layer 82 is formed by a silicidation process. To that end, a layer comprising a silicide-forming metal is deposited by, for example, a CVD process or a physical vapor deposition (PVD) process. The silicide-forming metal may be comprised of titanium (Ti), cobalt (Co), nickel (Ni), or another suitable refractory metal selected. An optional capping layer comprised of a metal nitride, such as titanium nitride (TiN) deposited by direct current (DC) sputtering or radio frequency (RF) sputtering, may be applied to the metal layer.

Annealing steps are used to form a silicide phase comprising the silicide layer 82 where the silicide-forming metal has a contacting relationship with semiconductor material of the external surface 66 of guard ring 73 and a contacting relationship with the top surface 25 of device region 17. Respective thin layers of the semiconductor material of the extrinsic base layer 64 and the semiconductor material of the device region 17 are consumed during the reaction forming the silicide phase. The silicide phase constituting silicide layer 82 may be characterized as a silicon-germanium silicide contingent upon the composition of extrinsic base layer 64. In an alternative embodiment, a separate additive layer of silicon-containing material may be deposited on a top surface of the extrinsic base layer 64 and the top surface 25 of the device region 17, before the metal layer is deposited, to provide additional semiconductor material for the silicide reaction.

In a representative silicidation process, the metal and semiconductor material (e.g., Si or SiGe) are thermally reacted to form an intermediate silicide material. The formation anneal is performed employing an ambient and a temperature known in the art to react the metal with semiconductor material. For example, the silicidation process may be conducted in an inert gas ambient (e.g., a nitrogen atmosphere) and by heating at an annealing temperature contingent on the type of silicide using one or more rapid thermal annealing (RTA) steps.

In a formation anneal of a silicidation process, metal-rich silicides initially form and continue to grow until the metal is consumed. When the metal layer has been consumed, silicides of lower metal content begin to appear and can continue to grow by consuming the metal-rich silicides. Following the formation anneal, any metal not converted into silicide and the optional capping layer may be removed with, for example, a selective wet chemical etch process. After the unconverted metal and optional capping layer are removed, the silicide layer 82 may be subjected to another anneal process to form a lower-resistance phase for the specific type of silicide comprising silicide layer 82. The temperature for the transformation anneal of the silicide layer 82 may be higher than the temperature of the formation anneal.

The emitter 78, intrinsic base layer 22, and collector 18 of the bipolar junction transistor 84 are vertically arranged. The intrinsic base layer 22 is located vertically between the emitter 78 and the collector 18. One p-n junction is defined at the interface between the emitter 78 and the intrinsic base layer 22. Another p-n junction is defined at the interface between the collector 18 and the intrinsic base layer 22.

The portion of the silicide layer 82 in contact with the top surface 25 of device region 17 acts as an anode of the Schottky barrier diode 86. A Schottky junction 88 of the Schottky barrier diode 86 is formed by the horizontal boundary between the silicide layer 82 and a cathode 80 defined by the nearby semiconductor material of the device region 17 beneath the silicide layer 82. The optional impurity-doped region 21 may contribute to forming the cathode 80. The Schottky junction 88 is defined proximate to, or at, the top surface 25 of the device region 17 and is contained within a plane that is substantially parallel to a plane containing the top surface 25. The guard ring 73 is raised above the top surface 25 of the device region 17 and, in particular, the top surface 77 of the guard ring 73 projects above the Schottky junction 88. The guard ring 73 functions to reduce leakage current of the Schottky barrier diode 86 at negative bias and high speed.

Standard back-end-of-line (BEOL) processing follows, which includes formation of contacts and wiring for the local interconnect structure, and formation of dielectric layers, via plugs, and wiring for an interconnect structure coupled by the local interconnect wiring with the bipolar junction transistor 84 and Schottky barrier diode 86, as well as other similar contacts for additional device structures such as CMOS transistors included in other circuitry fabricated on the substrate 10. Other active and passive circuit elements, such as diodes, resistors, capacitors, varactors, and inductors, may be fabricated on substrate 10 and available for use in the BiCMOS integrated circuit.

Fabrication of the Schottky barrier diode 86 requires only one additional mask that is shared with other devices, such as PIN diodes or high-voltage field-effect transistors. The one additional mask is used to open an area on the top surface 25 of the device region 17 following the deposition of the intrinsic base layer 22. The guard ring 73 of the Schottky barrier diode 86 is formed from selectively grown semiconductor material (e.g., Si or SiGe) of the extrinsic base layer 64.

The bipolar junction transistor 84 is formed using device region 16 concurrently with the formation of the Schottky barrier diode 86 using device region 17. The collector region 18 of the bipolar junction transistor 84 and the optional impurity-doped region 21 of the Schottky barrier diode 86 are concurrently formed using the respective device regions 16, 17 with the same processes and the same masks. The extrinsic base of the bipolar junction transistor 84 and the guard ring 73 of the Schottky barrier diode 86 are concurrently by portions of the epitaxially-grown extrinsic base layer 64 formed on the respective device regions 16, 17. During the front-end-of-line (FEOL) portion of the fabrication process, the device structure of the bipolar junction transistor 84 and Schottky barrier diode 86 may be replicated across different portions of the surface area of the substrate 10.

Figure 11:
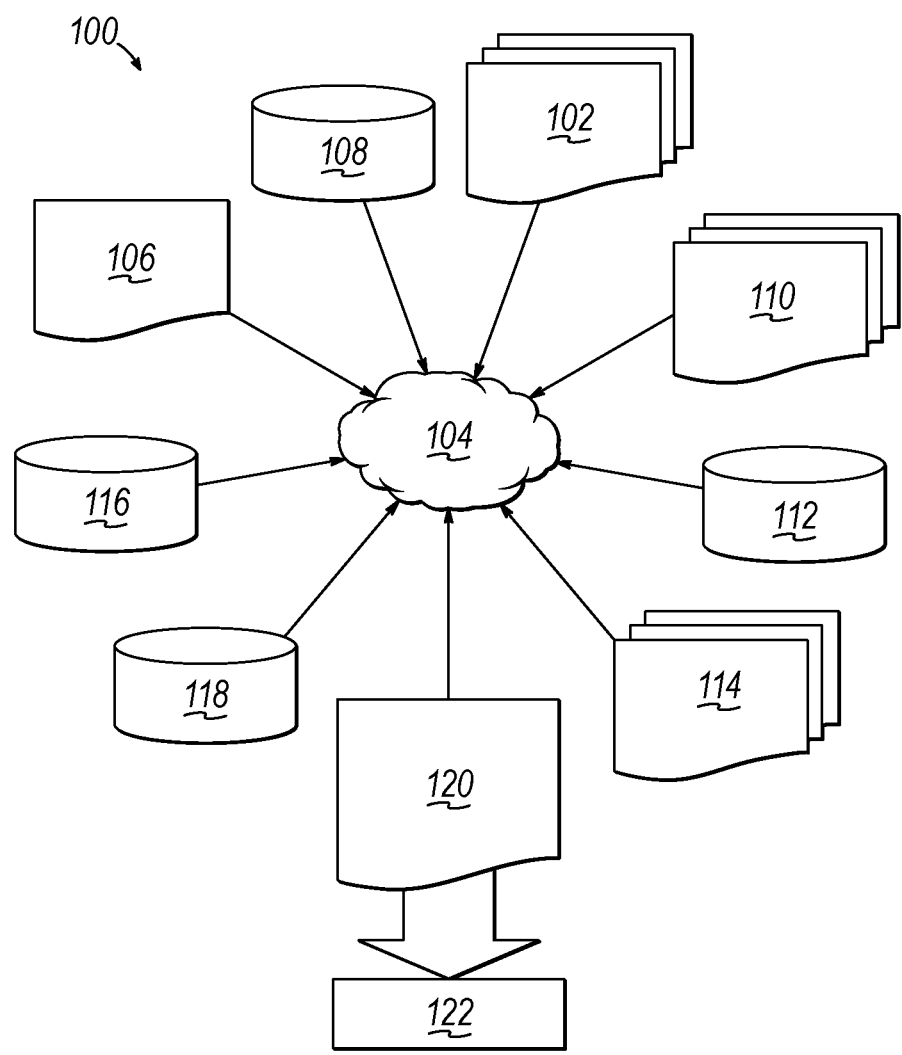
FIG. 11 is a flow diagram of a design process used in semiconductor design, manufacture, and/or test.

FIG. 11 shows a block diagram of an exemplary design flow 100 used for example, in semiconductor IC logic design, simulation, test, layout, and manufacture. Design flow 100 includes processes, machines and/or mechanisms for processing design structures or devices to generate logically or otherwise functionally equivalent representations of the design structures and/or devices described above and shown in FIGS. 10A, 10B. The design structures processed and/or generated by design flow 100 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g., e-beam writers), computers or equipment for simulating design structures, any apparatus used in the manufacturing or test process, or any machines for programming functionally equivalent representations of the design structures into any medium (e.g., a machine for programming a programmable gate array).

Design flow 100 may vary depending on the type of representation being designed. For example, a design flow 100 for building an application specific IC (ASIC) may differ from a design flow 100 for designing a standard component or from a design flow 100 for instantiating the design into a programmable array, for example a programmable gate array (PGA) or a field programmable gate array (FPGA) offered by Altera® Inc. or Xilinx® Inc.

FIG. 11 illustrates multiple such design structures including an input design structure 102 that is preferably processed by a design process 104. Design structure 102 may be a logical simulation design structure generated and processed by design process 104 to produce a logically equivalent functional representation of a hardware device. Design structure 102 may also or alternatively comprise data and/or program instructions that when processed by design process 104, generate a functional representation of the physical structure of a hardware device. Whether representing functional and/or structural design features, design structure 102 may be generated using electronic computer-aided design (ECAD) such as implemented by a core developer/designer. When encoded on a machine-readable data transmission, gate array, or storage medium, design structure 102 may be accessed and processed by one or more hardware and/or software modules within design process 104 to simulate or otherwise functionally represent an electronic component, circuit, electronic or logic module, apparatus, device, or system such as those shown in FIGS. 10A, 10B. As such, design structure 102 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 104 preferably employs and incorporates hardware and/or software modules for synthesizing, translating, or otherwise processing a design/simulation functional equivalent of the components, circuits, devices, or logic structures shown in FIGS. 10A, 10B to generate a netlist 106 which may contain design structures such as design structure 102. Netlist 106 may comprise, for example, compiled or otherwise processed data structures representing a list of wires, discrete components, logic gates, control circuits, I/O devices, models, etc. that describes the connections to other elements and circuits in an integrated circuit design. Netlist 106 may be synthesized using an iterative process in which netlist 106 is resynthesized one or more times depending on design specifications and parameters for the device. As with other design structure types described herein, netlist 106 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 104 may include hardware and software modules for processing a variety of input data structure types including netlist 106. Such data structure types may reside, for example, within library elements 108 and include a set of commonly used elements, circuits, and devices, including models, layouts, and symbolic representations, for a given manufacturing technology (e.g., different technology nodes, 32 nm, 45 nm, 84 nm, etc.). The data structure types may further include design specifications 110, characterization data 112, verification data 114, design rules 116, and test data files 118 which may include input test patterns, output test results, and other testing information. Design process 104 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 104 without deviating from the scope and spirit of the invention. Design process 104 may also include modules for performing standard circuit design processes such as timing analysis, verification, design rule checking, place and route operations, etc.

Design process 104 employs and incorporates logic and physical design tools such as HDL compilers and simulation model build tools to process design structure 102 together with some or all of the depicted supporting data structures along with any additional mechanical design or data (if applicable), to generate a second design structure 120. Design structure 120 resides on a storage medium or programmable gate array in a data format used for the exchange of data of mechanical devices and structures (e.g., information stored in an IGES, DXF, Parasolid XT, JT, DRG, or any other suitable format for storing or rendering such mechanical design structures). Similar to design structure 102, design structure 120 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 10A, 10B. In one embodiment, design structure 120 may comprise a compiled, executable HDL simulation model that functionally simulates the devices shown in FIGS. 10A, 10B.

Design structure 120 may also employ a data format used for the exchange of layout data of integrated circuits and/or symbolic data format (e.g., information stored in a GDSII (GDS2), GL1, OASIS, map files, or any other suitable format for storing such design data structures). Design structure 120 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 10A, 10B. Design structure 120 may then proceed to a stage 122 where, for example, design structure 120: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The term "vertical" refers to a direction perpendicular to the horizontal, as just defined. The term "lateral" refers to a dimension within the horizontal plane.

It will be understood that when an element is described as being "connected" or "coupled" to or with another element, it can be directly connected or coupled with the other element or, instead, one or more intervening elements may be present. In contrast, when an element is described as being "directly connected" or "directly coupled" to another element, there are no intervening elements present. When an element is described as being "indirectly connected" or "indirectly coupled" to another element, there is at least one intervening element present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of fabricating a device structure using a first device region and a second device region comprised of a first semiconductor material of a substrate, the method comprising:
   forming a cathode of a Schottky barrier diode in the first semiconductor material of the first device region;
   patterning a hardmask layer to form a first opening registered with the first device region and a second opening registered with the second device region;
   forming a guard ring for the Schottky barrier diode inside the first opening in the hardmask layer and in direct contact with a first portion of the top surface of the first device region using a selective epitaxial growth process so that a second semiconductor material of the guard ring has an epitaxial relationship with the first semiconductor material in the first device region;
   concurrently forming an extrinsic base of a vertical bipolar junction transistor inside the second opening in the hardmask layer when the guard ring is formed, wherein the extrinsic base is comprised of the second semiconductor material in an epitaxial relationship with the first semiconductor material of the second device region; and
   forming an anode of the Schottky barrier diode in a contacting relationship with a second portion of the top surface of the first device region,
   wherein a Schottky junction is defined between the anode and the cathode.

2. The method of claim 1 wherein the hardmask layer is comprised of a dielectric material that does not support epitaxial growth of the semiconductor material of the guard ring.

3. The method of claim 1 wherein forming the anode of the Schottky barrier diode in a contacting relationship with the second portion of the top surface of the device region comprises: forming a silicide layer on the second portion of the top surface of the first device region.

4. The method of claim 1 wherein the guard ring surrounds the second portion of the top surface of the first device region, and the anode is formed after the guard ring is formed.

5. The method of claim 4 wherein forming the anode of the Schottky barrier diode on the second portion of the top surface of the first device region comprises: forming a silicide layer on the second portion of the top surface of the first device region.

6. The method of claim 5 wherein the silicide layer is further formed on an external surface of the guard ring.

7. The method of claim 4 further comprising:
   implanting ions into the first device region for increasing an electrical conductivity of the cathode of the Schottky barrier diode.

8. The method of claim 7 further comprising: concurrently implanting the ions into the second device region to form a collector of the vertical bipolar junction transistor.

9. The method of claim 1 wherein concurrently forming the extrinsic base of the vertical bipolar junction transistor comprises: forming an intrinsic base layer on a top surface of the second device region, wherein the extrinsic base layer of the vertical bipolar junction transistor is formed on the intrinsic base layer by the selective epitaxial growth process.

10. The method of claim 1 wherein the first semiconductor material is single crystal silicon, and the second semiconductor material is single crystal silicon or single crystal silicon-germanium.

11. The method of claim 1 wherein forming the cathode of the Schottky barrier diode in the first semiconductor material of the first device region comprises:
    forming trench isolation regions in the substrate.

* * * * *